United States Patent [19]

Ash

[11] Patent Number: 4,761,616
[45] Date of Patent: Aug. 2, 1988

[54] VOLTAGE CONTROLLED OSCILLATOR

[75] Inventor: Darrell L. Ash, Sachse, Tex.

[73] Assignee: R. F. Monolithics, Inc., Dallas, Tex.

[21] Appl. No.: 93,315

[22] Filed: Sep. 4, 1987

[51] Int. Cl.⁴ .......................... H03B 5/00; H03B 5/24
[52] U.S. Cl. ............................ 331/107 A; 331/108 B;
    331/135; 331/177 R; 333/193
[58] Field of Search ........... 331/107 A, 108 B, 117 R,
    331/135, 136, 137, 177 R; 333/193

[56] References Cited

U.S. PATENT DOCUMENTS

| | | | |
|---|---|---|---|
| 3,667,067 | 5/1972 | Levell | 331/108 B X |
| 3,868,595 | 2/1975 | Capps, Jr. et al. | 331/108 A |
| 3,950,713 | 4/1976 | Lewis | 333/151 |

*Primary Examiner*—Eugene R. LaRoche
*Assistant Examiner*—David Mis
*Attorney, Agent, or Firm*—Alfred E. Hall

[57] ABSTRACT

A voltage controlled oscillator circuit having an amplifier coupled in series with a feedback circuit and having adjustable voltage means coupled to the phase shifting element means for varying the phase shift of the phase shifting element output signal thereby varying the frequency of oscillation of the oscillator circuit.

22 Claims, 2 Drawing Sheets

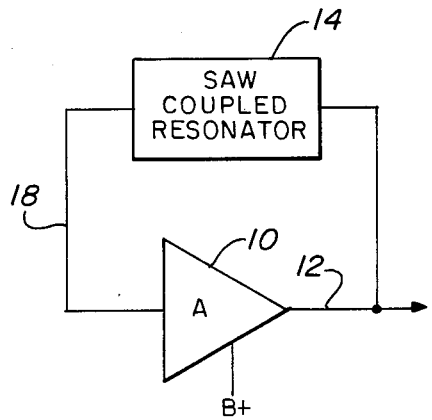
FIG. 1
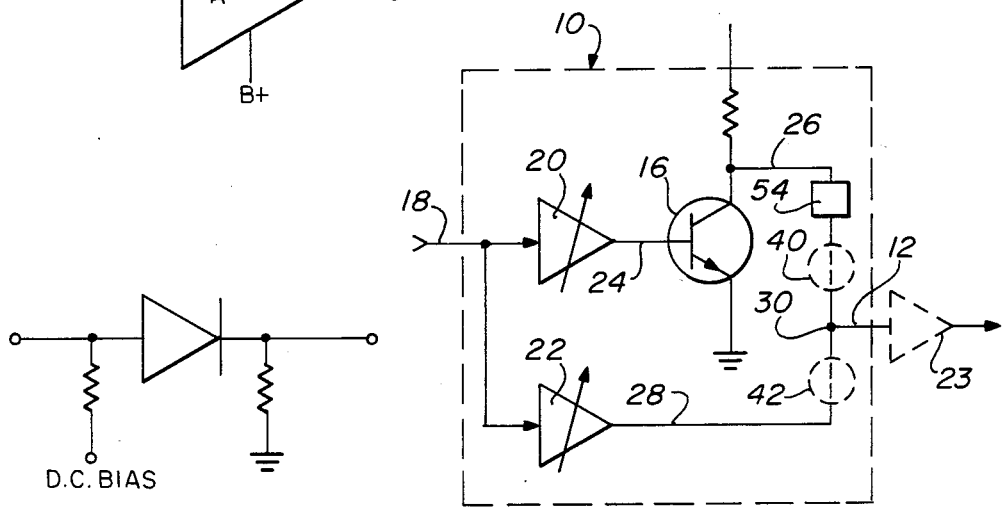
FIG. 5
PRIOR ART
FIG. 2
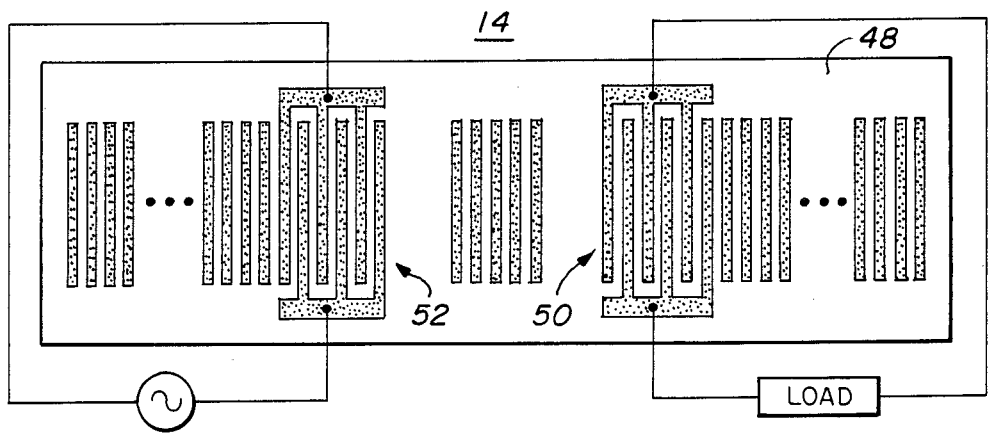
FIG. 4
PRIOR ART

VOLTAGE CONTROLLED OSCILLATOR

BACKGROUND OF THE INVENTION

The present invention relates to a voltage controlled oscillator and in particular to a voltage controlled oscillator in which a surface acoustic wave device is coupled as a feedback element or network to a driving means such as an amplifier to form the oscillator circuit and having an adjustable voltage control coupled to the amplifier for varying the phase shift of the amplifier output over a predetermined range to cause the oscillator circuit to oscillate at a predetermined frequency within a predetermined range.

Oscillators are well-known in the art and phase shift oscillators have been formed utilizing surface acoustic wave devices. U.S. Pat. No. 3,950,713 discloses a surface acoustic wave delay line for use with an amplifier to form an oscillator circuit. The surface acoustic wave delay line oscillator disclosed in this patent is for operation at relatively low frequencies since, as pointed out therein, at high frequencies reflection problems become so pronounced that alternative techniques must be used. It has a frequency which depends upon the construction of the surface acoustic wave delay line. U.S. Pat. No. 3,868,595 also discloses a surface acoustic wave delay line oscillator operating at UHF frequencies. In this case, the inputs and outputs of the amplifier and the surface acoustic wave device must be coupled to matching networks including inductors, capacitors and resistors. Again, the oscillator operates at a frequency depending upon the construction of the surface acoustic wave delay line and its matching networks.

The present invention relates to a solid state voltage controlled oscillator circuit which utilizes a surface acoustic wave device as the signal feedback network and which includes a driving means such as an amplifier having a signal input and a signal output and having a predetermined signal phase shift between its output and input. By coupling an adjustable voltage means to the amplifier for varying the phase shift of the amplifier output over a predetermined range, the circuit can be caused to oscillate at a predetermined frequency within the predetermined range. Such voltage controlled oscillator is relatively inexpensive, very small and compact and meets the requirements for stable oscillators which are shock insensitive and temperature insensitive. This is the case because it can be used at high frequencies but does not include inductors, or capacitors thus providing a relatively shock insensitive and temperature insensitive voltage controlled oscillator whose temperature sensitivity is primarily dependent upon the surface acoustic wave device characteristics.

SUMMARY OF THE INVENTION

Thus the present invention relates to a voltage controlled oscillator circuit comprising driving means having a signal input and a signal output and having a predetermined signal phase shift between said output and said input, a signal feedback network having an output signal coupled as an input signal to said driving means and a signal output from said driving means coupled as an input signal to said feedback network to form said oscillator circuit, and adjustable voltage means coupled to said driving means for varying said phase shift of said driving means output signal over a predetermined range to cause said circuit to oscillate at a predetermined frequency within said predetermined range.

The invention also relates to a method of forming a voltage controlled oscillator circuit comprising the steps of forming a driving means having a signal input and signal output and having a predetermined signal phase shift between said output and said input, coupling the signal output of a signal feedback network as a signal input to said driving means and coupling a signal output of said driving means as the input signal to said feedback to form said oscillator circuit, and coupling an adjustable voltage means to said driving means for varying said phase shift of said driving means output signal over a predetermined range to cause said circuit to oscillate at a predetermined frequency within said predetermined range.

BRIEF DESCRIPTION OF THE DRAWINGS

These and other objects of the present invention will be more fully disclosed in conjunction with the accompanying drawings in which:

FIG. 1 is a schematic representation of an oscillator circuit utilizing a SAW coupled resonator as the signal feedback network and utilizing the driving means and the adjustable voltage means for varying the frequency of the oscillator;

FIG. 2 is a schematic representation of the driving means which may be an amplifier which has an adjustable signal voltage means coupled to the driving means for varying the phase shift of the driving means output signal over a predetermined range;

FIG. 4 is a schematic representation of a prior art coupled resonator which can be used as the signal feedback network in FIG. 1;

FIG. 5 is a schematic representation of a PIN diode which can be used as the adjustable signal voltage means in FIG. 2 and whose current can be adjusted to vary the magnitude of its output signal depending upon the voltage applied thereto.

DETAILED DESCRIPTION OF THE DRAWINGS

Figure 3:
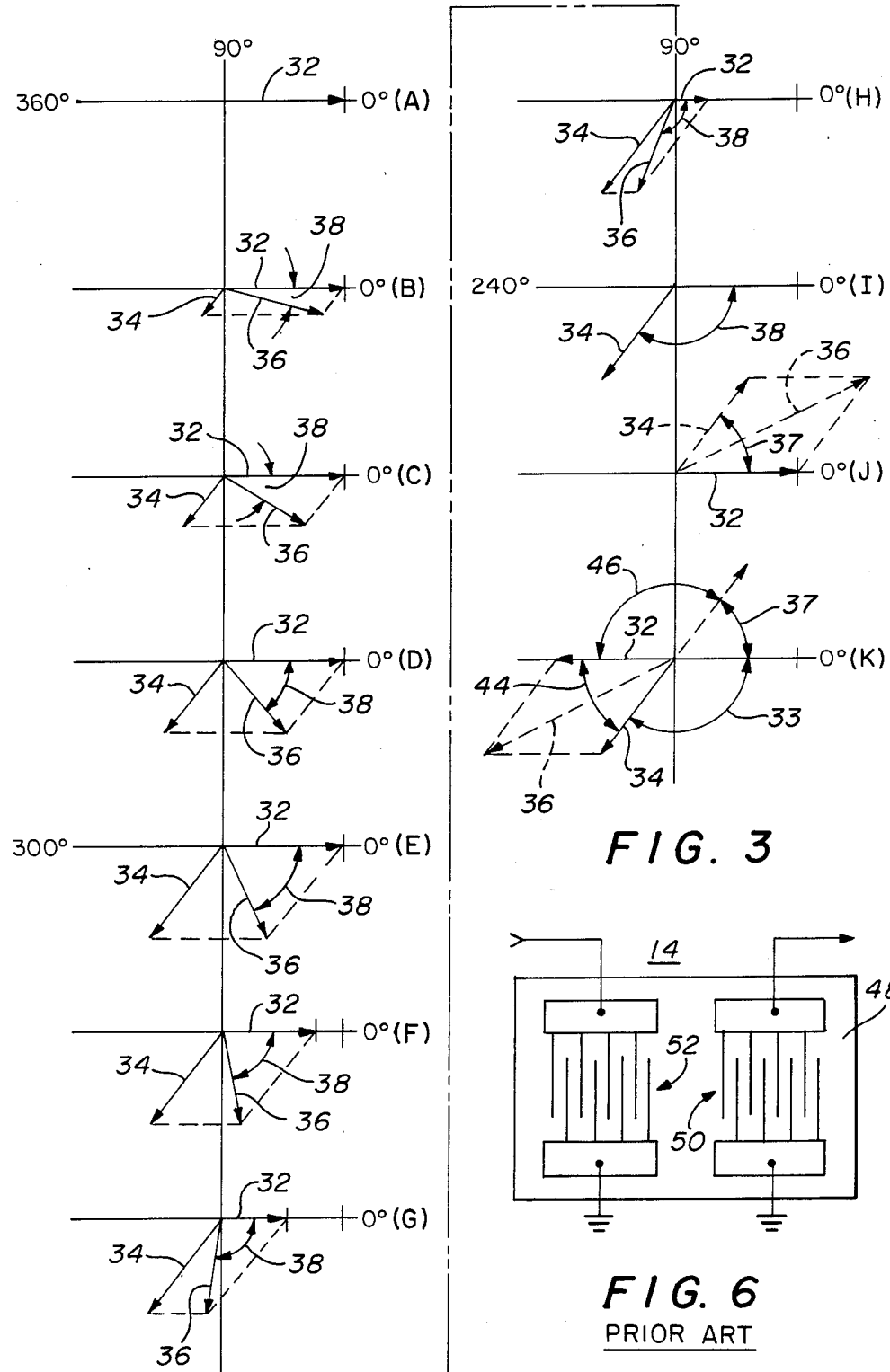
FIGS. 3 A-K are the variation of the phase shift of the driving means output signal to form a predetermined range within which oscillation may occur.

Oscillators are, of course, old and well-known in the art and the art includes many different types of oscillators. One such type is the phase shift oscillator which utilizes surface acoustic wave coupled resonators shown in FIG. 1 and disclosed in detail in commonly assigned co-pending patent application Ser. No. 07/093,292, filed Sept. 4, 1987, and entitled COUPLED RESONATOR PHASE SHIFT OSCILLATOR. In such design, the output of the amplifier or driving means 10 on line 12 is also coupled as an input to a SAW coupled resonator 14. SAW coupled resonator 14, as is well-known in the art, has a 180° phase shift between the 3 dB points of the frequency response curve which includes the frequency of the output signal of amplifier 10 on line 12. This oscillator operates at a fixed frequency which is determined by the phase shift through amplifier 10 and the design of the SAW coupled resonator 14.

The oscillator shown in FIG. 1 can be easily converted to a voltage controlled oscillator by modifying the amplifier 10 as shown in FIG. 2. In that case, transistor 16 has a phase shift from its input to its output which varies according to the type of amplifier and the frequency at which it operates. For example only, assume that the phase shift through transistor 16 at UHF frequencies is approximately 240°. Under these conditions, when the circuit of FIG. 2 is used as the amplifier 10 in FIG. 1, the SAW coupled resonator 14 is simply designed to have a phase shift which when added to the phase shift through amplifier 10 (including transistor 16 in FIG. 2) will cause oscillation. Thus, for example only, if it is assumed that 0° phase shift occurs in amplifiers 20 and 22 in FIG. 2, the phase shift range of the coupled resonator would vary from +90° to 270°; i.e. the phase shift at center frequency is 180°.

The operation of the oscillator in FIG. 1, as stated earlier, is at a fixed frequency. Suppose it is desired to operate the oscillator in FIG. 1 at variable frequencies. One manner of accomplishing this would be to make the circuit into a voltage controlled oscillator and the circuit illustrated in FIG. 2 accomplishes the desired result. The output of the SAW coupled resonator 14 on line 18 is also shown in FIG. 2 as the input signal to amplifier 10 and is coupled to two adjustable voltage means 20 and 22. The voltage control means may be, for instance, a conventional amplifier whose gain may be adjustable by varying a d.c. bias level. Other devices such as PIN diodes may be used. In such case, because PIN diodes have no gain, an amplifier 23 must be used. PIN diodes are well-known in the art and provide a variable impedance which is adjustably controlled by a d.c. bias at extremely high frequencies. Such a device is shown in FIG. 5. The output of the voltage control means 20 on line 24 in FIG. 2 is coupled as an input to the base of transistor 16. Since transistor 16 is a common emitter transistor, the output on line 26 is 180° out of phase with the input signal on line 18. In addition, at extremely high frequencies, there is an additional delay through transistor 16 which is added to the 180° phase shift to create the total phase shift through transistor 16. As stated earlier that total phase shift depends upon the transistor 16 and the frequency at which it is operating. Assume in this case that an additional 60° is added to the 180° phase shift thus making a total phase shift of 240° through the transistor 16.

The same input signal on line 18 from the SAW coupled resonator 14 is also coupled to the second voltage control means 22 the output of which, on line 28, is coupled to the junction 30 thus being combined with the output of transistor 16 on line 26 to produce the resultant output on line 12 which is coupled as the input to the SAW coupled resonator and is also the output of the oscillator. The magnitude of the output signal from the voltage contol means 20 and 22 on lines 24 and 28 respectively can be varied substantially from 0 to a maximum. Since the phase shift through the voltage control means 20 and 22 is identical, this phase shift can be ignored only for purposes of explanation of the operation of this device. Thus the phase shift on lines 24 and 28 from voltage control means 20 and 22 can be considered to be 0°.

Consider the operation of the device with respect to FIG. 3. Assume in FIG. 3A that voltage control means 20 has been adjusted or controlled with a voltage input to cause no output on line 24 while voltage control means 22 is adjusted to provide a maximum output on line 28. This is represented in FIG. 3A as a vector 32 at 0°. Thus the output on line 12 from the amplifier in FIG. 1 or in FIG. 2 is at 0° since there is no output from transistor 16. Assume now that voltage control means 20 has a voltage applied thereto to provide an output from transistor 16 of the magnitude shown by the vector 34 in FIG. 3B. It will be noted that this vector 34 is at an angle of 240° which is the total phase shift from the input on line 18 to the output on line 26 in FIG. 2. Note however, that when the vector 32 and the vector 34 are added the resultant vector 36 has now shifted from 0° by an amount designated by the angle 38.

Looking now at FIG. 3C it will be realized that as vector 34 is increased in magnitude by adjusting the voltage on voltage control means 20, the vector 36 continues to rotate in a clockwise direction and the angle 38 increases. Likewise, in FIG. 3D, again as vector 34 increases in magnitude by adjusting the voltage applied to the voltage control means 20, the vector 36 continues to rotate in a clockwise direction and the angle 38 continues to increase thus changing the phase shift of the output signal from transistor 16 on line 26. It will be noted in FIG. 3E that when the vectors 32 and 34 are of the same maximum magnitude, vector 36 will be at an angle 38 which will be at −60° or +300°.

Assume now as shown in FIG. 3F that vector 34 is held at its maximum magnitude while the output of voltage control means 22 on line 28 is decreased by changing the bias voltage thus reducing the length of vector 32 representing the magnitude of the output signal on line 28. The combined result of vectors 32 and 34 is vector 36 in FIG. 3F and angle 38 continues to increase in a clockwise direction. This trend continues as shown in FIGS. 3G and 3H. As shown in FIG. 3I, when the bias voltage on voltage control means 22 is adjusted to eliminate any output on line 28 then the total output of the amplifier 10 is from transistor 16 on line 26 and is represented by vector 34 which is at 240°. Thus it can be seen that the phase shift through amplifier 10 is varied from 240° through 0° or in a predetermined frequency range of 120° through the use of voltage control means 20 and 22.

Thus by replacing amplifier 10 in FIG. 1 with the amplifier 10 illustrated in FIG. 2, the oscillator of FIG. 1 becomes a voltage controlled oscillator in which the phase shift of the amplifier 10 output signal may be varied over a predetermined range to cause the oscillator circuit to oscillate at a predetermined frequency within the predetermined range.

It will be noted in FIG. 2 that voltage control means 20 is in series with amplifier 16 which increases the amplitude or magnitude of the output signal on line 26. In order to substantially equalize the two vectors 32 and 34 at their maximum magnitudes, an impedance pad 54 may be placed in line 26 to decrease the amplitude of vector 34 at its maximum to that of the magnitude of the signal on line 28 at its maximum. Thus the two vectors are kept substantially balanced. There is of course a small decrease in the magnitude of the resultant vector 36 as the phase is varied as can be seen in FIGS. 3A–I and, for example, as shown in FIG. 3E, at a phase angle of −60°, there is an approximate 1.3 dB loss but this is within acceptable ranges.

If any 180° phase reversal device 40 well-known in the art is placed in output line 26 in FIG. 2, then vector 34 is reversed 180° as shown in FIG. 3J. The resultant combination of vectors 32 and 34 provide a vector 36 which can be varied in the same manner as indicated previously between the angles of 0° an 60° as shown by arrow 37 in FIG. 3J.

If a phase reversal device 42 is placed only in line 28 from the output of voltage control means 22, the result is shown in FIG. 3K wherein vector 32 has now been reversed to the 180° position and the resultant of vectors 32 and 34 is vector 36 which varies in an angle 44 between 180° and 240°.

In like manner, if 180° phase reversal devices 40 and 42 are both placed in both output lines 26 and 28 respectively as shown in FIG. 2, then the phase shift through amplifier 10 will be through angle 46 in FIG. 3K which will be from 60° to 180°. Thus, as can be seen in FIG. 3K, angle 38 represents a predetermined variable frequency range when the vector outputs on lines 26 and 28 are combined, angle 37 represents the variable frequency range covered when a 180° phase reversal device 40 is placed in line 26, angle 44 represents a predetermined phase shift or variable frequency range when the phase reversal device 42 is placed in line 28 and angle 46 represents a predetermined phase shift or variable frequency range when 180° phase reversal devices 40 and 42 are placed in both lines 26 and 28 respectively. Thus all 360° of phase shift can be covered with the device shown in FIG. 2.

Figure 6:
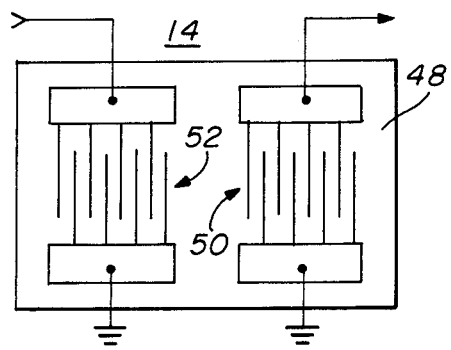
FIG. 6 is a schematic representation of a prior art surface acoustic wave delay line which can be used as either the signal feedback network in FIG. 1 or the phase shift device in FIG. 2.

The SAW device 14 may be of the type shown in FIG. 4 which is a coupled resonator with properly spaced grating and reflections as is well-known in the art or it may be a delay line surface acoustic wave device as shown in FIG. 6. In either case, the device is formed by placing transducers 50 and 52 on a piezoelectric crystal substrate 48. Such construction is old and well-known to those skilled in the art and will not be discussed in detail herein.

Also, the SAW coupled resonator 14 shown in FIG. 1 may well be formed with a single phase unidirectional transducer as disclosed in commonly assigned co-pending application Ser. No. 677,513, filed Dec. 4, 1984, and entitled SINGLE PHASE UNIDIRECTIONAL SURFACE ACOUSTIC WAVE TRANSDUCER. In that case, it was pointed out that single phase unidirectional transducers are well-known in the art utilizing split finger electrodes or three phase construction or may be formed as set forth and claimed in co-pending application Ser. No. 677,513 by a novel circuit utilizing transducers having λ/4 electrodes. Such single phase unidirectional transducers constructed according to the commonly assigned co-pending application utilize structures similar to that shown in FIG. 4 and have quarter wave length transducers and generate a unidirectional transmission depending upon the orientation of the transducers 50 and 52 on the piezo-electric substrate 48.

It is also noted that amplifier 10 instead of using a transistor 16 as the phase shift device, could be a surface acoustic wave delay line as shown in FIG. 6. As is well-known in the art there is a phase shift between the input and output of the delay line 14 and by providing voltage control means 20 and 22 (or amplifier 23) for the necessary amplification of the signal, the system would function substantially as described in reference to FIG. 2 with the phase shift device being transistor 16.

Thus the voltage controlled oscillator disclosed herein has all of the advantages that are associated with surface acoustic wave devices without the use of coils and capacitors. That is, they are temperature stable and shock insensitive. They are small, light weight and economical to construct. Further, they provide a voltage controlled oscillator simply by using voltage control means such as PIN diodes or amplifiers which are old and well-known in the art and which provide an impedance or gain respectively which is controllable by a DC bias at extremely high frequencies. Thus the device can be used at UHF frequencies. Further, because the SAW coupled resonator or delay line can use quarter wave length electrodes, the device is not limited to the frequencies required by surface acoustic wave devices formed with electrode widths less than a quarter wave length.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. A voltage controlled oscillator circuit comprising:
   a. a phase shifting element having a signal input terminal and a signal output terminal and having a predetermined signal phase shift between said input and said output terminals,
   b. a signal feedback network having an output signal terminal and having an input terminal coupled to said output terminal of said phase shifting element to form said oscillator circuit, and
   c. adjustable voltage control means coupled between said output terminal of said feedback network and said input terminal of said phase shifting element and between said output terminal of said feedback network and said output terminal of said phase shifting element for varying the phase shift of said signal at said output terminal of said phase shifting element over a predetermined frequency range to cause said circuit to oscillate at any predetermined frequency within said predetermined frequency range.

2. An oscillator circuit as in claim 1 wherein said adjustable voltage control means comprises:
   a. a first device receiving said feedback network output signal and generating an output signal for use as an input signal to said phase shifting element,
   b. a second device receiving said feedback network output signal and generating an output signal which is to be combined with said phase shifting element output signal at said phase shifting element output terminal,
   c. a first voltage control means coupled to said first device for varying the magnitude of said input signal coupled to said phase shifting element so as to vary the magnitude of the phase shifted output of said phase shifting element,
   d. a second voltage control means coupled to said second device for varying the magnitude of the output signal from said feedback network, and
   e. means for combining the outputs of said phase shifting element and said second device so as to obtain a phase shifted signal at said phase shifting element output terminal at any predetermined frequency in said predetermined frequency range.

3. An oscillator circuit as in claim 2 wherein said phase shifting element is a transistor amplifier.

4. An oscillator circuit as in claim 3 wherein each of said first and second voltage control means comprises a PIN diode having an impedance controlled by a d.c. bias voltage.

5. An oscillator circuit as in claim 2 wherein said phase shifting element is a surface acoustic wave delay line.

6. An oscillator circuit as in claim 5 wherein each of said first and second voltage control means comprises an amplifier having a variable d.c. bias voltage for adjusting the gain thereof.

7. An oscillator circuit as in claim 5 further comprising:
   a. a PIN diode forming each of said first and second control voltage means, said PIN diodes having an impedance controlled by a d.c. bias voltage, and
   b. an amplifier coupled to the output terminal of said phase shifting element for amplifying said combined output signal being coupled to said input of said feedback network.

8. An oscillator circuit as in claim 2 wherein said signal feedback network is formed with a coupled resonator surface acoustic wave device.

9. An oscillator circuit as in claim 8 wherein said coupled resonator is formed with single phase unidirectional transducers.

10. An oscillator as in claim 2 further including an impedance element coupled to the output of said phase shifting element for substantially equalizing the magnitude of the maximum output of each of said phase shifting element and said second device.

11. An oscillator as in claim 2 further including a 180° phase reversal device coupled to the output of at least one of said phase shifting element and said second device so as to change said predetermined frequency range in which said circuit oscillates.

12. A method of forming a voltage controlled oscillator circuit comprising the steps of:
   a. forming a phase shifting element having a signal input terminal and a signal output terminal and having a predetermined signal phase shift between said input and said output terminals,
   b. forming a signal feedback network having an output signal terminal and having an input signal terminal coupled to said output terminal of said phase shifting element to form said oscillator circuit, and
   c. coupling adjustable voltage control means between said output terminal of said feedback network and said input terminal of said phase shifting element and between said output terminal of said feedback network and said output terminal of said phase shifting element for varying the phase shift of said signal at said output terminal of said phase shifting element over a predetermined frequency range to cause said circuit to oscillate at any predetermined frequency within said predetermined frequency range.

13. A method as in claim 12 wherein the step of coupling said adjustable voltage means between said feedback network and said input and output of said phase shifting element further comprises the steps of:
   a. receiving said feedback network output signal with a first device and generating an output signal for use as an input signal to said phase shifting element,
   b. receiving said feedback network output signal with a second device and generating an output signal which is to be combined with said phase shifting element output signal at said phase shifting element output terminal,
   c. coupling a first voltage control means to said first device for varying the magnitude of said input signal coupled to said phase shifting element so as to vary the magnitude of the phase shifted output of said phase shifting element, and
   d. coupling a second voltage control means to said second device for varying the magnitude of the output signal from said feedback network, and
   e. combining the outputs of said phase shifting network and said second device so as to obtain a phase shifted signal at said phase shifting element output terminal at any predetermined frequency in said predetermined frequency range.

14. A method as in claim 13 further comprising the step of forming said phase shifting element with a transistor.

15. A method as in claim 14 further including the step of forming said first and second voltage control means with PIN diodes having an impedance controllable by a d.c. bias voltage.

16. A method as in claim 13 further including the step of forming said phase shifting element with a surface face acoustic wave delay line.

17. A method as in claim 16 further comprising the step of providing an amplifier as each of said first and second voltage control means, each of said amplifiers having variable d.c. bias voltage for adjusting the gain thereof.

18. A method as in claim 16 further comprising the steps of:
   a. forming each of said first and second voltage control means with a PIN diode having an impedance controlled by d.c. bias voltage, and
   b. coupling an amplifier to the output terminal of said phase shifting element for amplifying said combined output signal being coupled to said input of said feedback network.

19. A method as in claim 13 further including the step of forming said signal feedback network with a coupled resonator surface acoustic wave device.

20. A method as in claim 19 further including the step of forming said coupled resonator with single phase unidirectional transducers.

21. A method as in claim 13 further including the step of coupling an impedance element to the output of said phase shifting element for substantially equalizing the magnitude of the outputs of said phase shifting element and said second device.

22. A method as in claim 13 further including the step of coupling a 180° phase reversal device to the output of at least one of said phase shifting means and said second device so as to change said predetermined frequency range in which said circuit oscillates.

* * * * *